(12) United States Patent
Sadler et al.

(10) Patent No.: US 7,667,371 B2
(45) Date of Patent: Feb. 23, 2010

(54) ELECTRONIC DEVICE AND CIRCUIT FOR PROVIDING TACTILE FEEDBACK

(75) Inventors: Daniel J. Sadler, Gilbert, AZ (US); David B. Cranfill, Antioch, IL (US); Michael F. Olley, Lake Zurich, IL (US); Eric V. Tashakkor, Waukegan, IL (US); Daniel H. Wagner, Grayslake, IL (US)

(73) Assignee: Motorola, Inc., Schaumburg, IL (US)

( * ) Notice: Subject to any disclaimer, the term of this patent is extended or adjusted under 35 U.S.C. 154(b) by 161 days.

(21) Appl. No.: 11/856,283

(22) Filed: Sep. 17, 2007

(65) Prior Publication Data

US 2009/0072662 A1 Mar. 19, 2009

(51) Int. Cl.
  *H01L 41/08* (2006.01)
(52) U.S. Cl. .................................. 310/317; 310/321
(58) Field of Classification Search ............ 310/316.01, 310/316.03, 317, 319
  See application file for complete search history.

(56) References Cited

U.S. PATENT DOCUMENTS

| 5,977,867 | A | 11/1999 | Blouin |
| 6,118,435 | A | 9/2000 | Fujita et al. |
| 6,563,252 | B2 * | 5/2003 | Schrod ................. 310/316.03 |
| 6,710,518 | B2 | 3/2004 | Morton et al. |
| 6,723,937 | B2 | 4/2004 | Englemann et al. |
| 6,807,445 | B2 * | 10/2004 | Baumann et al. .............. 607/57 |
| 6,943,785 | B2 | 9/2005 | Chou et al. |
| 7,176,735 | B2 | 2/2007 | Yoshikawa |
| 2005/0017947 | A1 | 1/2005 | Shahoian et al. |
| 2005/0225202 | A1 | 10/2005 | Vogeley et al. |
| 2006/0017705 | A1 | 1/2006 | Yoshikawa |
| 2006/0028428 | A1 | 2/2006 | Dai et al. |
| 2006/0050059 | A1 | 3/2006 | Satoh et al. |
| 2006/0052143 | A9 | 3/2006 | Tuovinen |

FOREIGN PATENT DOCUMENTS

| EP | 1566728 A1 | 8/2005 |
| WO | 03054849 A1 | 7/2003 |

OTHER PUBLICATIONS

International Search Report; PCT/US2007/080759; dated Mar. 18, 2008.
International Search Report; PCT/US2008/076474; dated Apr. 7, 2009.

\* cited by examiner

*Primary Examiner*—Mark Budd
(74) *Attorney, Agent, or Firm*—Vedder Price P.C.

(57) ABSTRACT

A circuit (800) for controlling at least one piezoelectric actuator (142) includes a piezoelectric drive circuit (802) that generates unidirectional voltage drive signal, also referred to as $V_{out}$, at node (804). The piezoelectric actuator drive circuit (802) includes a boost switcher circuit or charging circuit (806), a buck switcher circuit or pulsed current sink discharge circuit (808) and a control signal generating circuit (810) that receives an input control signal (812) from, for example, a keyboard processor or other suitable processor (604) indicating that the device has requested generation of haptic feedback utilizing the piezoelectric actuator (142). The control signal generating circuit (810) provides at least two pulse-with-modulated control signals, one to control the charging circuit and one to control the discharging circuit to produce the unidirectional voltage drive signal, that in one example is a raised cosine drive signal (904).

22 Claims, 7 Drawing Sheets

ELECTRONIC DEVICE AND CIRCUIT FOR PROVIDING TACTILE FEEDBACK

RELATED CO-PENDING APPLICATION

This application is related to co-pending application Ser. No. 11/590,494, having as inventors Dai et al., entitled "Electronic Device Providing Tactile Feedback" filed on Oct. 30, 2006, and owned by instant assignee.

FIELD OF THE INVENTION

The present invention generally relates to electronic devices and more particularly to a portable communication device having tactile feedback.

BACKGROUND OF THE INVENTION

Morphing user interfaces will be an important design consideration for the next generation of portable electronic devices. A "morphing user interface" is an interface whose appearance changes as the device's use changes (e.g., from a phone to a camera, camera to music player, music player to phone, etc.). This input interface is simpler and more intuitive to use since only the context-relevant functions are shown at any given time, with the interface elements that are not related to the current context being inactive and hidden. The concept of a morphing user interface also preferably includes the total lack of feedback to the user when the user may contact those user interface elements which are hidden and inactive in the current user interface context.

Traditionally, mechanical dome switches have been used to provide haptic (tactile) feedback when users press a key. However, dome switches do not function well with morphing graphic user interfaces; therefore, haptics or active feedback becomes a critical enabler. Rotary or linear vibration motors can provide tactile feedback of sorts with optimized driving algorithms, but their buzz-like vibration profiles are very different from a dome switch's sharp mechanical click. On the other hand, piezoelectric actuators can produce a much more realistic click sensation, providing the perception that the user has pressed a real, physical key. This realistic click can be applied to individual surfaces, creating a more "local" response (like a dome switch) as opposed to the "global" response of vibration motors that shake the entire device.

This localized tactile feedback, which can be alternatively termed "localized haptics", sends tactile feedback to a user by means of movement of a portion of a handheld device, or portions of its surfaces. Locally actuated touch screen and navigation keys are two examples of localized haptics. In the case of a cell phone, the feedback can be limited to a navigation key, a touch screen, or buttons on holding surfaces of the phone, e.g., side stripes.

One type of haptic feedback is described in U.S. Pat. No. 6,710,518. An electromechanical transducer produces an impulse of mechanical energy that propagates through a mounting boss to the entire device. This mechanism is suitable for providing a "call alert" which vibrates the entire device, but does not allow for selective feedback to individual input locations (keys, buttons, arrows, etc).

U.S. Patent Publications 2006/0050059 and 2006/0052143 present another type of haptic feedback. One or more piezoelectric actuators are placed, typically at the corners, under an input device that needs to be actuated (e.g., a keypad or a touch-sensitive display). When a voltage is applied, the piezoelectric actuators deform, either pushing or pulling the entire input device in a given direction. As a result of this movement, the device gives a tactile response to the user's hand or finger operating at the input device. The most widely used piezoelectric actuators for this purpose are either unimorph or bimorph actuators (also referred to as "benders"). Unimorph actuators are made of a single piezoelectric ceramic element bonded to a metal shim, whereas bimorph actuators comprise a metal shim bonded between two piezoelectric ceramic elements. The unimorph actuator's bending motion comes from the tendency of either in-plane shrinkage or expansion of the piezoelectric ceramic element under applied electric field against the mechanical constraint from the metal shim. In the case of a bimorph actuator, the two piezoelectric ceramic elements are driven such that one shrinks while the other expands, both in their respective planes, causing the bending motion. A typical placement of the benders is to anchor the edge of a circular bender, or both ends of a stripe bender, on a base structure. The center of a circular bender, or the middle of a stripe bender which has the maximum displacement, is usually used to drive a mechanical load, as illustrated in both U.S. Patent Publications 2006/0050059 and 2006/0052143. It is worth noting that stand-alone piezoelectric ceramics cannot generate these relatively high displacements; rather it is the bonded structure of the piezoelectric ceramic element(s) and metal shim that makes such high displacement possible.

It is challenging to optimize piezoelectric actuator drive circuits for handheld devices. The circuit must be able to drive significant capacitive loads (e.g., 100 nanofarads) to peak voltages of 100 or more volts, with controlled rises and falls in voltage and time using low supply voltages (e.g., 3V-5V).

Known circuits for driving a piezoelectric actuator (e.g., one or more piezoelectric elements) may utilize short low voltage control pulses to control and shape the drive signal of a piezoelectric actuator such that the output to the actuator approximates a voltage sinusoid. However, such solutions in the prior art are typically designed for driving a piezoelectric element bidirectionally (i.e. from a large negative to large positive voltage). As such, these circuits are non-optimal for generating a positive voltage waveform as required to simulate a key click tactile feel. Not only are they overly complex and costly to implement, but if driven at a high enough voltage, they can even de-polarize the piezoceramic element and thus render piezoelectric unimorph actuators ineffective. In addition, solutions have been proposed in which arbitrary predefined waveforms such as saw-tooth, sine, half sine, and pulse, are played to create specific haptics effects based on a user input; however, such solutions teach no method of generating such signals and do not teach a suitable method of generating such signals at high enough voltages to drive a piezoelectric unimorph actuator.

Accordingly, it is desirable to provide electronic devices having click-like tactile feedback provided by low cost, thin piezoelectric devices, driven by a very simple and low-cost, yet highly flexible, drive circuit. Other desirable features and characteristics of the present invention will become apparent from the subsequent detailed description and the appended claims, taken in conjunction with the accompanying drawings and this background of the invention.

BRIEF SUMMARY OF THE INVENTION

An electronic device provides tactile feedback provided by a low cost, thin piezoelectric device giving tactile feedback emulating a click-like feel. Electronic circuitry positioned within the housing drives the piezoelectric actuator(s) in response to a user activating the input device. After the user input is sensed, the circuitry provides a voltage waveform to activate one or more piezoelectric actuators, which flexes the chassis plate and the input device to emulate the click-like feel.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

Figure 1:
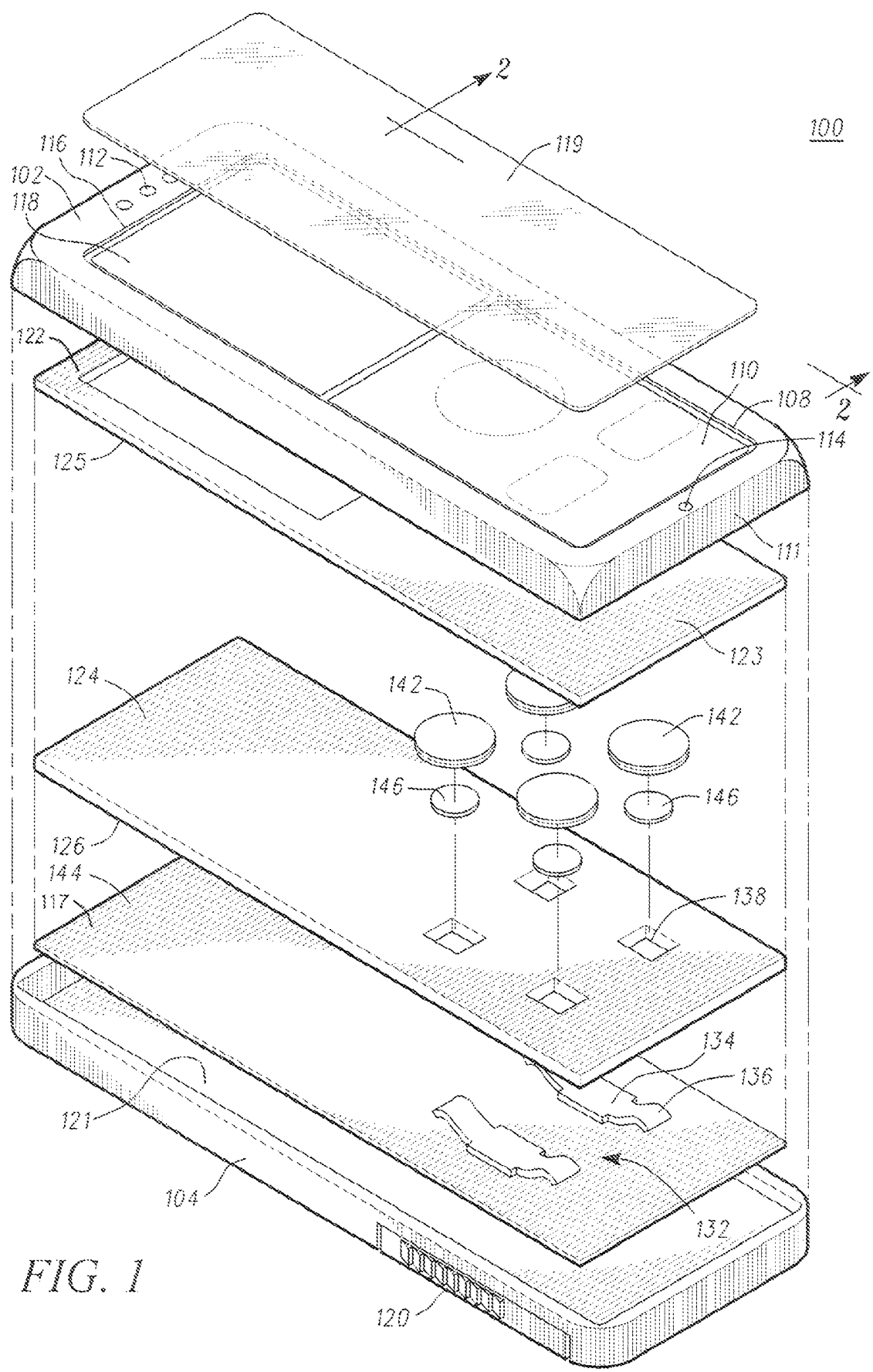
FIG. 1 is an exploded view of a cellular telephone in accordance with an exemplary embodiment.

The following detailed description of the invention is merely exemplary in nature and is not intended to limit the invention or the application and uses of the invention. Furthermore, there is no intention to be bound by any theory presented in the preceding background of the invention or the following detailed description of the invention.

The electronic circuitry for controlling at least one piezoelectric actuator includes a piezoelectric actuator drive circuit that includes a pulsed, inductive boost charging circuit, operatively responsive to a first pulse-width-modulated control signal, and a pulsed constant-current-sink discharge circuit that is operatively responsive to a second pulse-width-modulated control signal. The pulse-width-modulated control signals may be such that the duty cycle remains constant, or the duty cycle may vary as a function of time. The pulsed inductive boost circuit controllably adds pre-determined "packets" of charge to the piezoelectric actuator, and the pulsed constant-current-sink discharge circuit controllably removes pre-determined packets of charge from a charged piezoelectric actuator. The piezoelectric actuator drive circuit applies pre-determined unidirectional voltage waveforms (e.g., higher than a DC supply voltage of the drive circuit) to the piezoelectric actuator, which provides haptic feedback to the user.

In another example, energy from a charged piezoelectric actuator (or element) is recycled to charge, for example, a voltage source such as a chargeable battery element (e.g., capacitor or other suitable charging element) or may serve as a voltage source for another circuit, if desired. In one example, multiple inductors are used in a boost switcher and buck switcher circuit. In another embodiment, a common single inductor and other configurations are used to reduce part count, cost, and circuit size.

In one example, a single control signal from either a main microprocessor, keypad processor, or other suitable controller, is used to provide the input control signal for the piezoelectric drive circuit. The input control signal may be converted to multiple control signals wherein each of the multiple control signals is a pulse-width-modulated control signal to control the charging and discharging of energy to one or more piezoelectric actuators. Among other advantages, the circuit for controlling at least one piezoelectric actuator may provide a small component count, high efficiency, and low cost implementation to be used in handheld and portable devices. The circuit for controlling the piezoelectric actuators enables a haptics keypad without the need for a mechanical dome switch keypad or other configurations, if desired. Users may be able to experience the benefits of morphing keypads, which changes depending on a current device mode, without having to sacrifice the familiar, expected tactile button feel. Other advantages will be recognized by those of ordinary skill in the art.

In one example, a piezoelectric ceramic element or multiple piezoelectric ceramic elements are directly bonded to the backbone structure of portable devices, for example the metal or plastic chassis of a cell phone. A chassis of a cell phone provides structural rigidity to the phone and serves as a structure plate for the attachment of most phone modules and components. The piezoelectric ceramic elements and an input device, e.g., a morphing user interface, are bonded to opposite sides of the chassis in one exemplary embodiment. Upon application of an electric field, the in-plane shrinkage or expansion of the piezoelectric elements causes localized flexion of the chassis and thus provides tactile feedback at the interface of the input device. The input device is not directly pushed or pulled by separated piezoelectric bender actuators as described in the prior art, but is part of the structure deformed (flexed) by the integrated piezoelectric ceramic elements. The motion of the input device is flexion, rather than an up/down movement by multiple piezoelectric actuators actuating at multiple points. The benefit of the approach over the prior art is that it does not require precise mechanical alignment of an actuating element with the structure that is being pushed or pulled.

In accordance with one exemplary embodiment, at least one piezoelectric actuator, e.g., a piezoelectric bender, is bonded directly to a metal plate abutting the input device for which the haptic feedback is intended. This direct placement provides flexional bending movement of the input device, and thus provides tactile feedback including true keyclick like tactile feedback to a user. This displacement of the input device is small, only 1.0 to 30.0 micrometers. This simple electro-mechanical structure is low cost and has proven reliability.

Piezoelectric actuators are uniquely capable of delivering fast, e.g., 1.0 to 10.0 milliseconds, high acceleration, e.g., 1-100 g, response needed to simulate key click responses. This class of response allows for advantageous replacement of mechanical dome switches by piezoelectric actuators both for ultra-thin, reduced-thickness keypads, and/or morphing user interfaces. Piezoelectric actuators are also able to provide a broadband movement (1-2000 Hz) as opposed to fixed frequency response of resonant electromagnetic vibration motors.

The piezoelectric elements shrink or expand in the lateral direction, that is, in their respective X-Y planes, when subject to an electric field perpendicular to their planes, causing a much amplified perpendicular movement with necessary constraint of being bonded to a hard surface, such as a phone chassis. The piezoelectric elements can be driven by a wide range of waveforms to tailor mechanical output to the user. A high slew rate step function can provide the highest acceleration and click-like feedback. Alternatively, multiple sine-waves can be used to generate feedback that might be characterized as a buzz. Piezoelectric actuators can also be operated in a wide frequency range, allowing broadband haptic responses. Power consumption of piezoelectric actuators is generally comparable to or less than that of DC rotary motors. The actuators' latency (the time required to ramp up to full speed) is small enough to allow users to have nearly instantaneous response in interactive applications.

Figure 2:
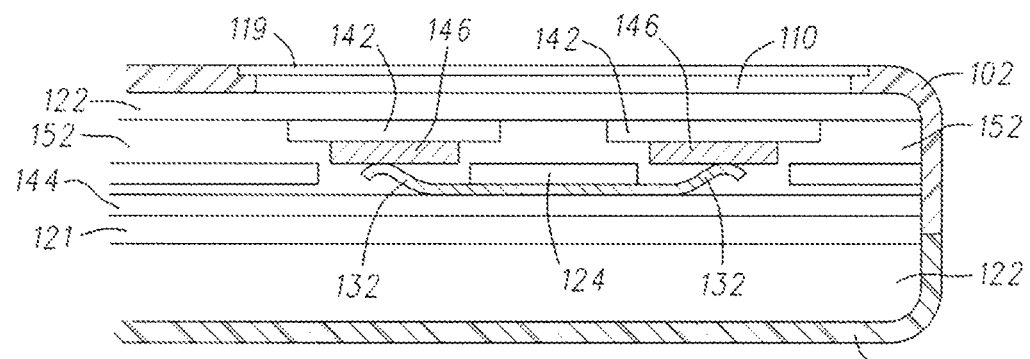
FIG. 2 is a partial cross section taken along line 2-2 of FIG. 1, without power applied to piezoelectric actuators contained within.

FIG. 1 is an exploded view of a cellular telephone 100 according to a first embodiment of the invention, and FIG. 2 is a partial cross section view taken along the line 2-2 of FIG. 1. The cellular telephone 100 is only one exemplary embodiment. It should be understood that any type of portable electronic device may be used with the invention described herein. The cellular telephone 100 comprises a front housing part 102, and a rear housing part 104. The front housing part 102 supports an optional antenna (not shown) and includes an opening 108 that accommodates a morphing user interface 110. A speaker grill 112 and a microphone grill 114 are also provided on the front housing part 102. A display opening 116 is also provided in the front housing part 102 that accommodates a display 118. A battery compartment cover 120 is provided for covering a battery compartment in the rear housing part 104. An opening (not shown) is provided in the battery floor 121 for wiring to couple a battery (not shown) positioned in the battery compartment 117 to circuitry (not shown) on the back side 126 of the printed circuit board 124. A transparent cover 119 is positioned over the display 118 and input device 110.

The front 102 and rear 104 housing parts enclose, among other items to be discussed, a chassis 122 secured to the front housing part 102. The chassis 122 comprises a first planar side 123 that securely positions the morphing user interface 110 within the opening 108 and the display 118 within the opening 116. The first planar side 123 of the chassis 122 is adjacent to and in contact with the planar side 111 of the input device 110. Also enclosed within the front 102 and rear 104 housing parts is a printed circuit board 124. A plurality of electrical circuit components (not shown), that make up one or more electrical circuits of the cellular telephone 100 are mounted on a back side 126 of the circuit board 124. Circuits of the cellular telephone 100 are more fully described below with reference to a functional block diagram shown in FIG. 6.

Contact devices 132 each include a base 134 secured to the circuit board 124 by a solder float (not shown), and arms 136 that extend through openings 138 in the circuit board 124 to make electrical contact with each of the piezo actuators 142. The contact devices are further coupled to circuitry (not shown) on the circuit board 124. Contact devices 132 comprise a conductive material, such as metal, and in the exemplary embodiment comprise a metal having an inherent spring action, or torque, to exert a force on the piezo actuators 142.

A layer of mylar 144 (FIG. 2) may be adhesively attached between a battery floor 121 of the rear housing part 104 and the contact devices 132. An air gap 152 exists between the printed circuit board 124 and the layer 144. The contact device 132 makes contact with the piezoelectric actuators 142, optionally through a metal contact 146, which is preferably gold. The contact device 132 may apply a spring force (as shown) against the metal contact 146 for improved conductibility. In accordance with the exemplary embodiment, the piezoelectric actuators 142 are positioned directly on a second planar side 125 of the chassis 122 that makes contact with the morphing user interface 110. The chassis 122 and morphing user interface 110 are positioned in an adjacent manner such that a flexing of the chassis 122 flexes the morphing user interface 110.

Figure 3:
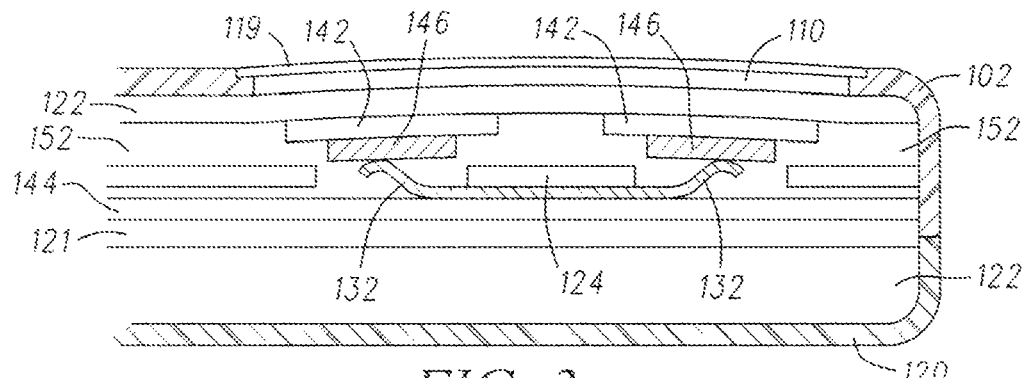
FIG. 3 is a partial cross section taken along line 2-2 of FIG. 1 with power applied to the piezoelectric actuators.

FIG. 2 shows one exemplary embodiment of how the morphing user interface 110 is secured by bonding to the front housing part 102 and the transparent cover 119 is bonded within an indent on front part 102 over the morphing user interface 110 and display 118. This example is only one way in which the morphing user interface 110 may be secured within the front housing part 102. Other examples may include, e.g., mechanical couplings. When an input, e.g., pushing on a displayed icon, is made to the morphing user interface 110, a signal is generated from, for example, a sensor (not shown) that detects movement or circuitry that detects the electronic signal generated by the input. This signal is sent to the contact devices 132 which activate the piezoelectric devices 142. The flexing movement of the piezoelectric devices 142 is transferred through the chassis 122 to the morphing user interface 110 (FIG. 3). Since the morphing user interface 110 is secured at its periphery, and not in the center, a flexing motion of the morphing user interface 110 results.

Figure 4:
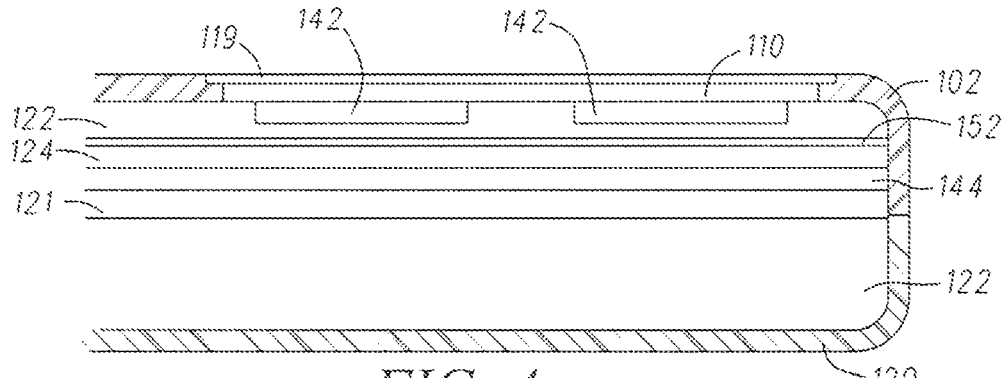
FIG. 4 is a partial cross section of a second exemplary embodiment without power applied to piezoelectric actuators contained within.
Figure 5:
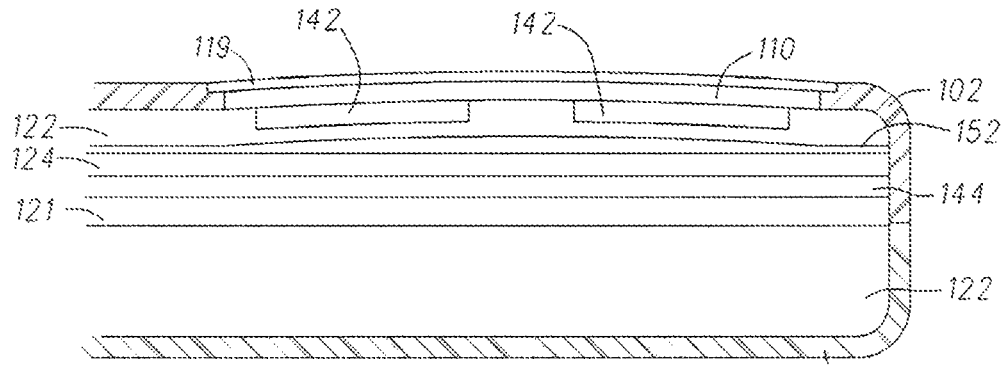
FIG. 5 is a partial cross section of the second exemplary embodiment with power applied to piezoelectric actuators.

A second exemplary embodiment shown in FIG. 4 includes the piezoelectric actuators 142 positioned within recesses of the chassis 122 and directly against the input device 110. A conductive bonding material (not shown) is positioned between the input device and the piezoelectric actuators 142 for securing the two together and providing power to the piezoelectric actuators 142. FIG. 5 illustrates the second exemplary embodiment with power applied to the piezoelectric actuators 142 and the resulting flexing of the chassis 122, input device 110, and transparent cover 119.

Figure 6:
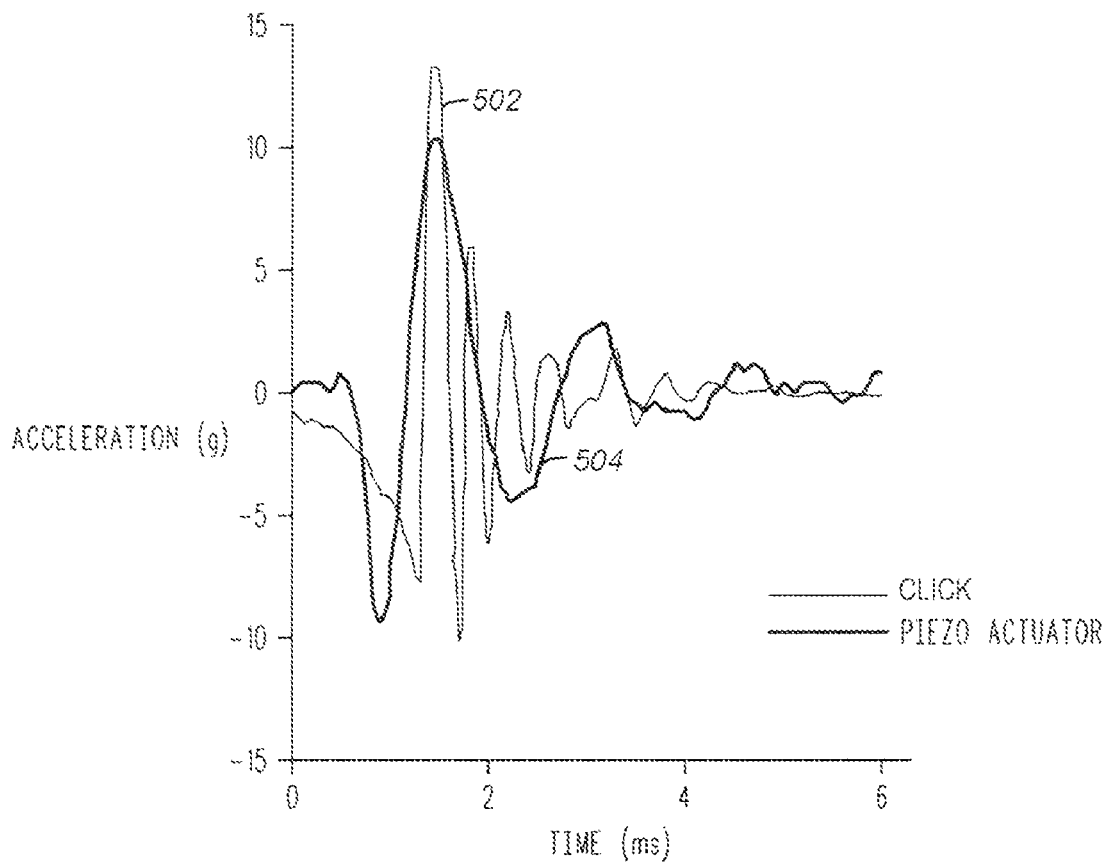
FIG. 6 is a graph illustrating a comparison of the acceleration of a mechanical dome switch versus a piezoelectric actuator of the exemplary embodiment.

FIG. 6 illustrates a comparison of the acceleration over time curve of a mechanical dome switch 502 versus the piezoelectric actuator 504 as described herein. The curves are very similar. The main characteristic of the acceleration profile is high peak acceleration, 1-100 g, in a relatively short time period (<10 ms). The high frequency component in the acceleration curve associates with the sound accompanying the tactile click feel.

Figure 7:
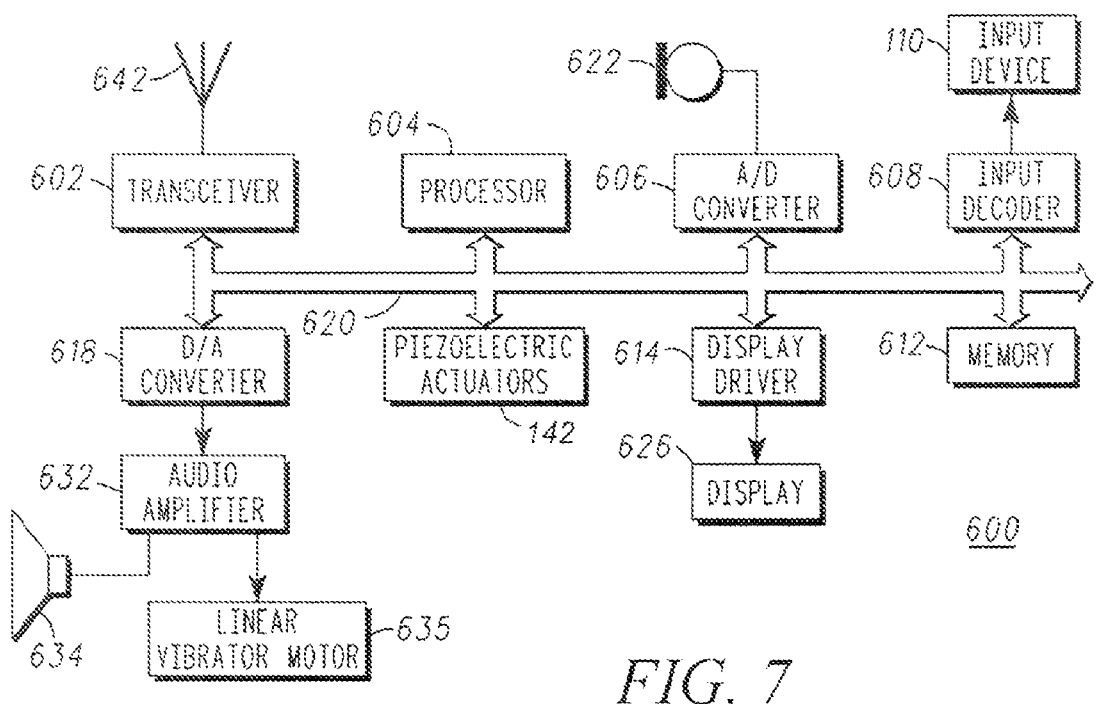
FIG. 7 is a block diagram of the cellular telephone shown in FIG. 1.

FIG. 7 is a block diagram of the cellular telephone 100 shown in FIGS. 1-3 according to the first embodiment of the invention. The cellular telephone 100 comprises a transceiver 602, a processor 604, an analog to digital converter (A/D) 606, an input decoder 608, a memory 612, a display driver 614, a digital to analog converter (D/A) 618, and piezoelectric actuators 142, all coupled together through a digital signal bus 620. The transceiver module 602 is coupled to the antenna 106. Carrier signals that are modulated by data, e.g., digitally encoded signals for driving digitally encoded voice audio, pass between the antenna 642, and the transceiver 602.

The input device 110 is coupled to the input decoder 608. The input decoder 608 serves to identify depressed keys, for example, and provide information identifying each depressed key to the processor 604. The display driver 614 is coupled to a display 626.

The D/A 618 is coupled through an audio amplifier 632 to a speaker 634 and a vibratory motor 635. The D/A 618 converts decoded digital audio to analog signals and drives the speaker 634 and vibratory motor 635. The audio amplifier 632 may comprise a plurality of amplifiers with each driving a separate speaker/vibratory motor combination.

The memory 612 is also used to store programs that control aspects of the operation of the cellular telephone 100. The memory 612 is a form of computer readable medium.

The transceiver 602, the processor 604, the A/D 606, the input decoder 608, the memory 612, the display driver 614, the D/A 618, the audio amplifier 632, and the digital signal bus 620, are embodied in the electrical circuit components 124 and in interconnections of the circuit board shown in FIG. 1.

Figure 8:
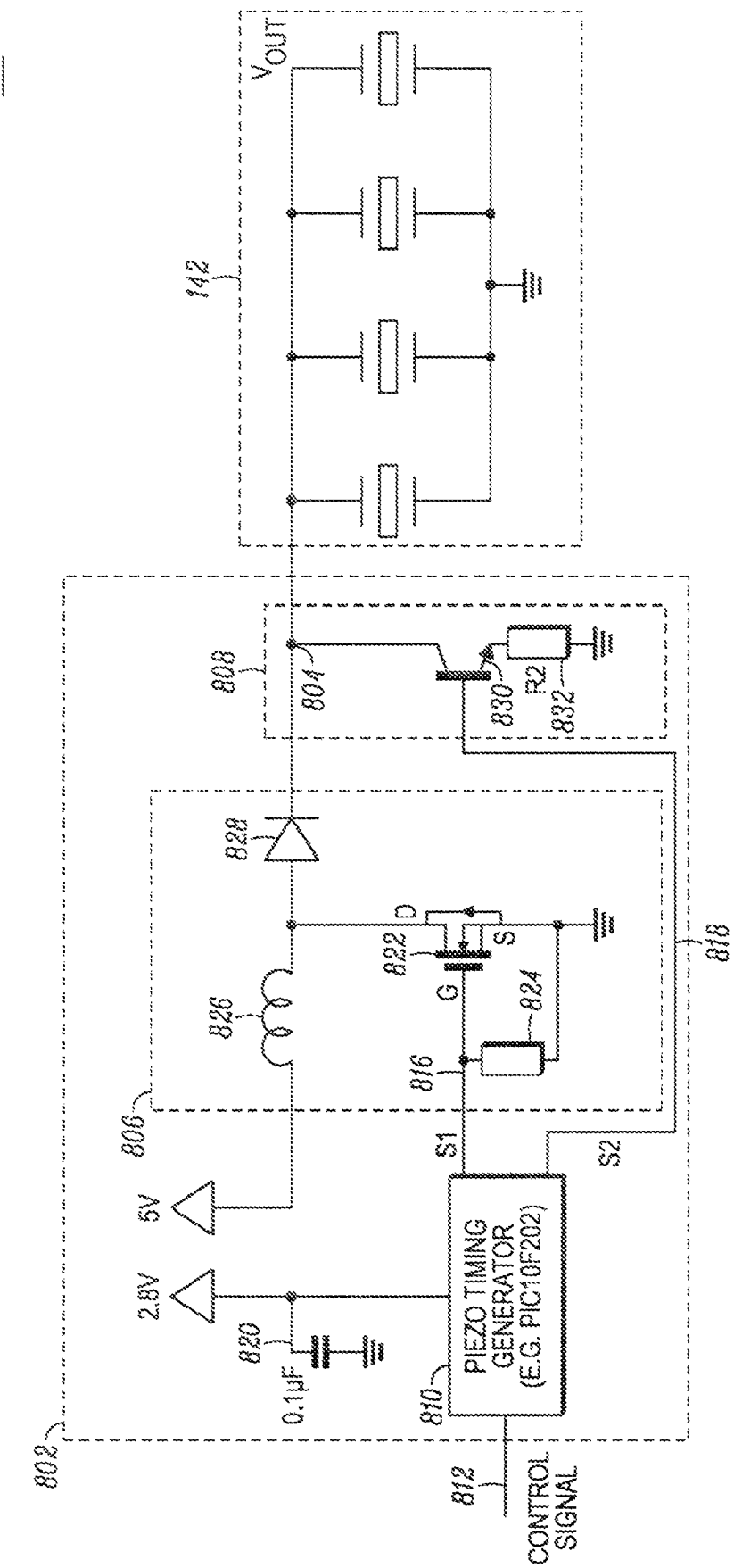
FIG. 8 is a circuit diagram illustrating one example of a circuit for controlling at least one piezoelectric actuator according to an exemplary embodiment.

FIG. 8 illustrates a circuit 800 for controlling at least one piezoelectric actuator 142 and in this example, is shown to include the piezoelectric actuator 142 containing a plurality of piezoelectric actuators or elements. The circuit 800 for controlling at least one piezoelectric actuator includes a piezoelectric drive circuit 802 that generates at least one unidirectional voltage drive signal, also referred to as $V_{out}$, at node 804. In practice, multiple unidirectional voltage drive signals may be provided in sequence to provide haptic feedback. In one preferable implementation, this voltage drive signal may be a single-cycle raised cosine wave. However other suitable waveforms may also be used if desired. The voltage level may be any suitable level, as in one example it may be 100-120V. However, it may be lower or higher depending on the application. The piezoelectric actuator drive circuit 802 that generates the voltage drive signal (example shown in FIG. 9) includes a boost switcher circuit or charging circuit 806, a buck switcher circuit or pulsed current sink discharge circuit 808 and a control signal generating circuit 810 that receives an input control signal 812 from, for example, a keyboard processor or other suitable processor 604 indicating that the device has requested generation of haptic feedback utilizing the piezoelectric actuator 142. As noted above, this may be done for example, in response to a touch screen detecting a user's finger or other touch-activated element, as is known in the art. In this example, the control signal generating circuit 810 is a timing generator such as, but not limited to, a PIC10F202 microcontroller, or any other suitable control signal generating circuit that receives the control signal 812 and generates a plurality of pulse-width-modulated control signals 816 and 818. The charging circuit 806 is operatively coupled to a supply voltage (e.g., 5 volts or any other suitable voltage) and the control signal generating circuit 810 may be supplied by the same or different supply voltage. In this example a different supply voltage is used and is a 2.8 volt supply voltage. One or more filter capacitors 820 may be suitably coupled to the supply voltages as desired.

The piezoelectric actuator drive circuit 802 generates the voltage drive signal $V_{out}$ at node 804. The inductive boost charging circuit 806 is responsive to the first varying pulse-width-modulated signal 816, controllably adding pre-determined packets of charge to the piezoelectric actuator 142, and the pulsed constant-current sink discharge circuit 808 is responsive to the second pulse-width-modulated control signal 818 and controllably draws pre-determined packets of charge from the charged piezoelectric actuator 142 after it has been charged by the inductive boost charging circuit 806. In this example, the control signal generating circuit 810 produces the first and second pulse-width-modulated control signals 816 and 818 which produce the voltage drive signal to actuate the piezoelectric actuator 142. This method of operation is open-loop, producing the desired voltage drive waveform for actuation of the piezoelectric elements, using a minimal number of components, facilitated by the fact that the output waveform and the control signals to produce it are pre-determined. Those skilled in the art will also understand that the timing generating circuit 810 may be fed back from the Vout node 804, if not also from the inductive boost supply node connected to inductor 826, in order to dynamically adjust the duty cycles of control signals 816 and 818 in the production of the desired waveform at Vout 804, thus operating in closed-loop fashion.

Referring back to FIG. 8, in this example, the charging circuit 806 includes a NMOS FET transistor 822 having a resistor 824 operatively coupled to across the gate and drain and an inductor (such as a 100 micro henry inductor 826) coupled between the supply voltage and the drain of the transistor 822. Resistor 824 is somewhat optional, and is used to ensure that the NMOS FET 822 remains inactive when not otherwise being actively driven by the timing generator 810, lest unnecessary current be drawn from the supply to the inductor when the circuit is intended to be inactive. The charging circuit 806 also includes a diode 828 operatively coupled between the drain or output of the transistor 822 and the Vout output node 804, which is also coupled to the pulsed current sink discharge circuit 808. In this example the current sink discharge circuit is a constant current sink discharge circuit. Also those skilled in the art will understand that the NMOS FET 822 could alternatively be any other electrically-operated switching device, such as an NPN bipolar junction transistor. However, an NMOS FET will usually be preferable; as such devices will generally require less drive strength from the timing generator 810, thus being easier to drive and more power-efficient overall.

In this example, the pulsed constant-current sink discharge circuit 808 includes a bipolar transistor 830 having an input that is driven by the second pulse-width-modulated control signal 818, and includes an emitter resistor 832 coupled as shown. The output of the transistor 830 is coupled to the piezoelectric actuator 142 and to the diode 828 and produces the falling portion of the voltage drive signal to drive the piezoelectric actuator 142, to controllably remove pre-determined packets of charge from the charged piezoelectric actuator. The output of the transistor 822 and the charging circuit 806 are used to charge the piezoelectric actuator 142 to produce the rising portion of the voltage drive signal. It will be recognized that the transistors described may be any suitable transistors depending upon the application including field effect or bipolar transistors for example. Indeed, transistor 830 could instead be an NMOS FET, but the effective activation voltage of an NPN bipolar transistor is smaller than that of an NMOS FET, ~0.7V rather than $\geq$1.2V, and exhibits significantly less part-to-part variation and less variation over temperature and load, so an NPN bipolar junction transistor is preferred for most consistent constant-current sink operation.

In a variation of the exemplar implementation shown in FIG. 8, the resistor 832 which sets the current of the pulsed constant-current sink is connected to a regulated low voltage supply rail for another circuit, rather than simply being connected to ground, provided that the second control signal 818 reaches an upper voltage which is at least the sum of the lower voltage supply rail and the voltage drops through the sink transistor 830 and the current-setting resistor 832. In this way, charge removed from the piezoelectric actuator through the pulsed constant-current sink 808 is re-cycled to help power another part of the device, which improves the device's overall power efficiency. As an example, changing the value of the current-setting resistor 832 from 330 ohms to 150 ohms and connecting it to a low voltage supply rail rather than ground allows for the charge removed from the piezoelectric actuator 142 to be discharged to a regulated 1.15V CPU core supply, rather than simply discharging that charge to ground, without even having to re-scale the progression of duty cycles presented by the timing generator circuit.

Figure 9:
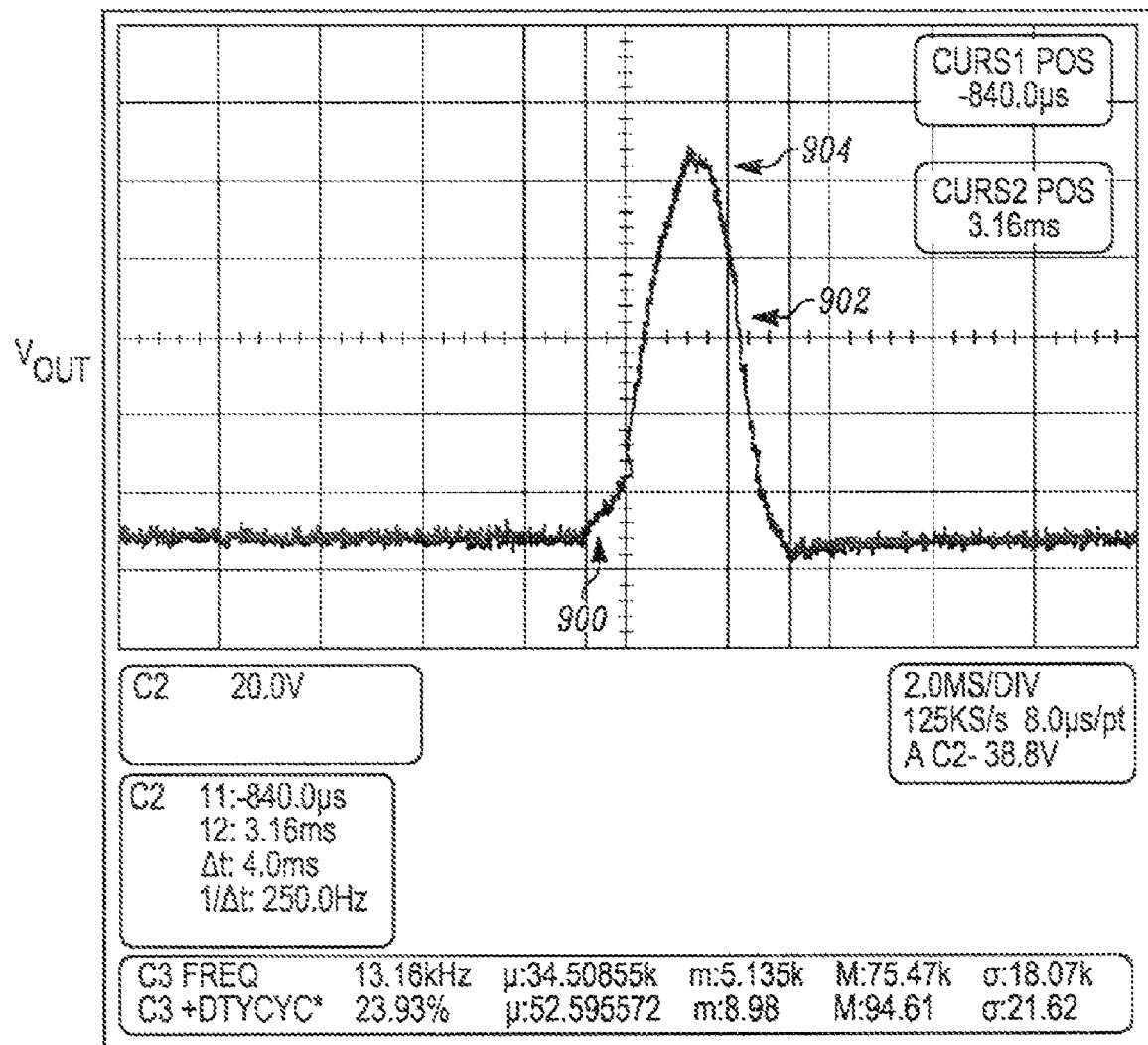
FIGS. 9 and 10 illustrate timing diagrams corresponding to control signals and one example of a unidirectional voltage drive signal that may be provided by a circuit such as that shown in FIG. 8.
Figure 10:
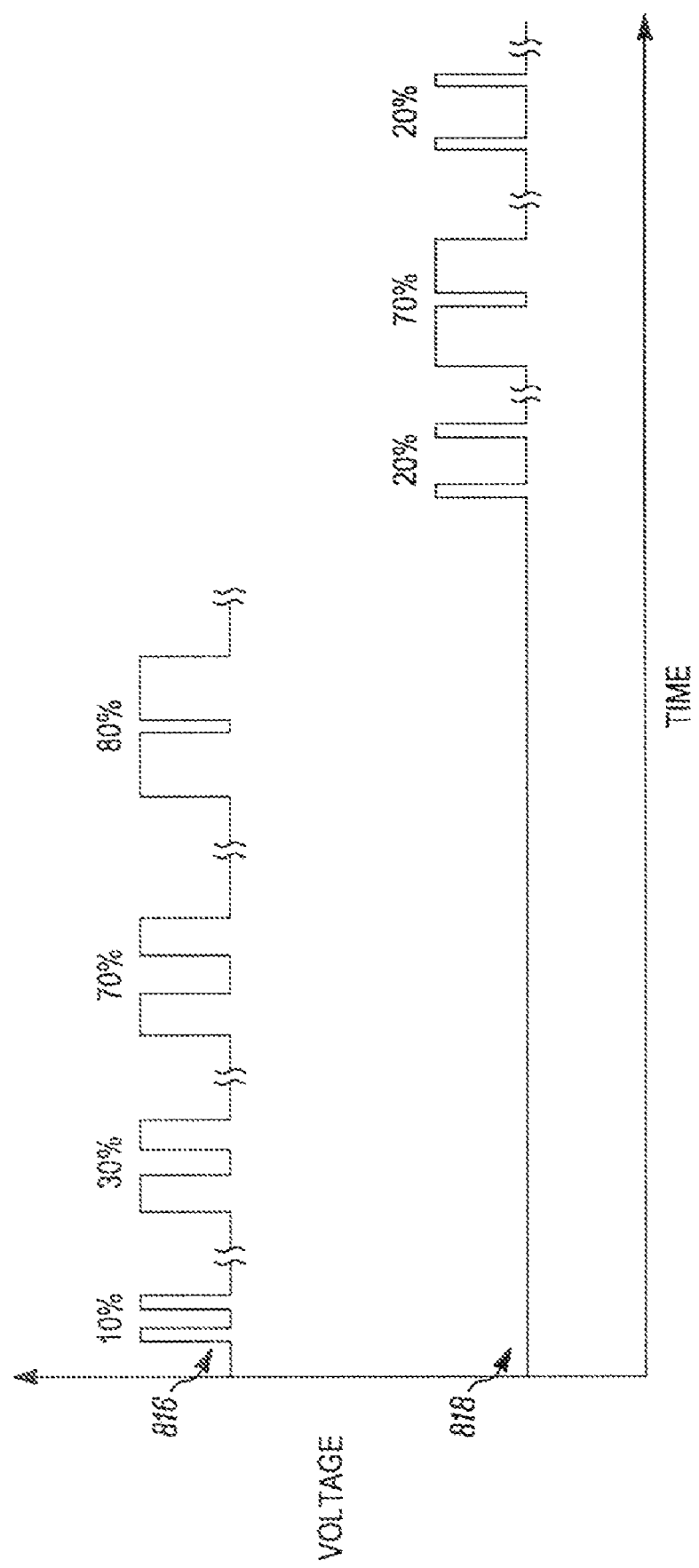

In one preferred embodiment, as shown in FIG. 9, $V_{out}$, the unidirectional voltage drive signal, is a raised cosine drive signal 904 that drives the piezoelectric actuator 142. In operation, the circuit of FIG. 8 utilizes a single input control signal 812 to produce two pulse-width-modulated outputs; namely the control signals 816 and 818 as shown in FIG. 10. However, any suitable number of control signals can be used. In this example, the control signal generating circuit 810 produces the first pulse-width-modulated control signal and the second pulse-width-modulated control signal 816 and 818 as varying duty cycle control signals to provide a relatively slow initial rise time shown by area 900 and relatively slow fall time 902 as part of the single ended raised cosine drive signal. For example, approximately 170 pulses at 100 kilohertz and varying duty cycles may be required to cause the generated raised cosine drive signal to increase from 5 volts to 100 volts in approximately 1.7 milliseconds. Generating the rising and falling portions of the drive signal 904 is performed using duty cycle progression by charging the charging circuit 806 using the pulse-width-modulated control signal 816 in a progression such as a 10%, 30%, 60%, 80%, 80%, 80%, 80%, 80%, duty cycle progression. Discharging the piezoelectric actuator may be done using pulse-width-modulated control signal 818 in a progression such as a 0%, 20%, 40%, 70%, 70%, 40%, 20%, and 20% duty cycle progression to produce the falling or discharge portion of the drive signal. The discharge cycle draws packets of charge from the charged piezoelectric actuator 142 by switching the constant-current sink 808 into the circuit via the second pulse-width-modulated control signal 818 once the maximum voltage is reached and the drive pulsing is halted. Use of the discharge scheme shown for example in FIG. 10 affords precise control over the instantaneous discharge rate to be achieved in the approximate drive signal. Preferably, the constant-current sink 808 should not be active in the circuit during the pulsing boost charging phase as this can thwart, in part or in full, the otherwise achievable rise time.

Figure 11:
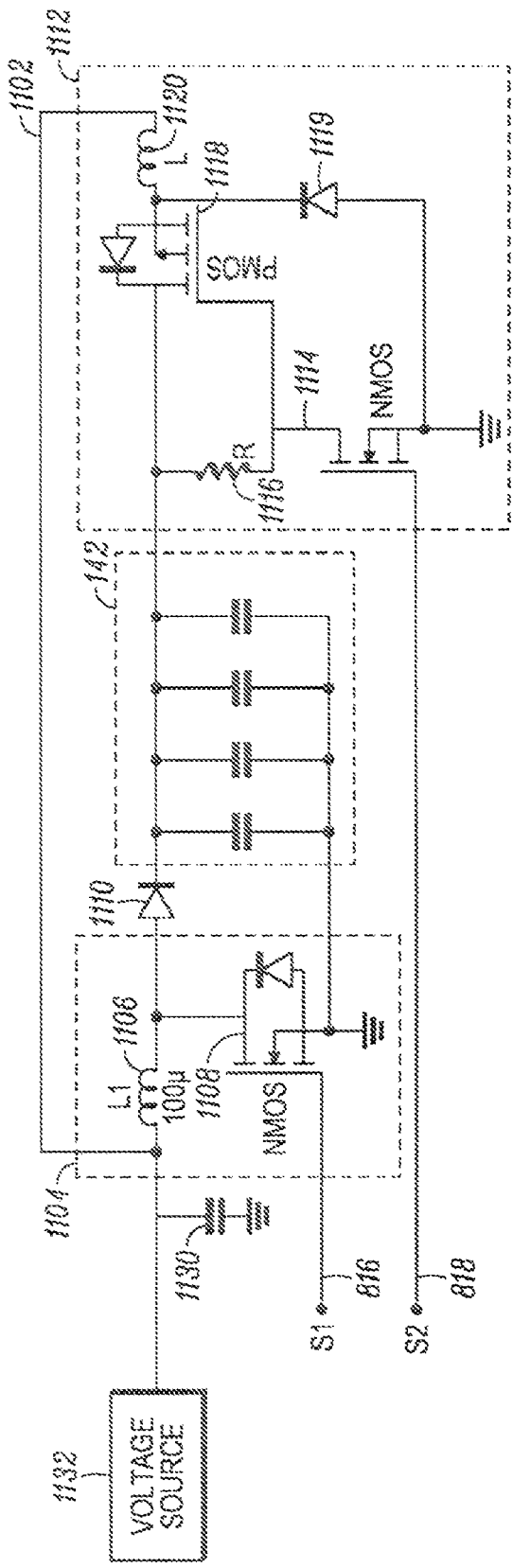
FIG. 11 is a circuit diagram illustrating the another exemplary embodiment of a circuit for controlling at least one piezoelectric actuator.

FIG. 11 illustrates another example of a circuit for controlling a piezoelectric actuator 142 which utilizes an inductive switched discharge circuit 1112 to provide efficient return of the energy from the piezoelectric actuators 142 back to, for example, a power supply rail, via return path 1102. In this example, a charging circuit 1104 or a boost switcher includes an inductor 1106 and a NMOS FET transistor 1108 as shown. Again, the diode 1110 serves to regulate the direction of the charge to the piezoelectric actuator 142. A buck switcher or discharge circuit 1112 includes an NMOS FET transistor 1114, pull-up resistor 1116, PMOS FET transistor 1118, diode 1119, and another inductor 1120 coupled as shown. A charging capacitor 1130 may be charged by the feedback of the energy being discharged from the piezoelectric actuator 142. Also as shown, a chargeable battery 1132 or other circuit may be connected to receive the energy provided by the discharge circuit 1112 via return path 1102. This switched inductive discharge circuit, also commonly known as a "buck switcher", makes the overall circuit more efficient by returning the bulk of the energy applied to the piezoelectric actuator 142 either back to the source battery or supply rail, or alternatively, to another supply rail for use by another portion of the electronic device.

The switched inductive discharge circuit 1112 is coupled to feedback energy from the piezoelectric actuator 142 to a voltage source node such as a battery, capacitor or other circuit. The switched inductive discharge circuit 1112 includes a discharge switching transistor 1114 that is responsive to the second pulse-width-modulated control signal 818 and has an output coupled to a resistive element 1116. An inductive element 1120 is coupled to the voltage source node and to the output pass transistor 1118. A diode 1119 is coupled to the output pass transistor 1118 and to the inductive element 1120. It will be understood that the duty cycle progression of the second control signal 818 differs in its exact composition from that sequence which is used to control a pulsed constant-current sink circuit 808.

Figure 12:
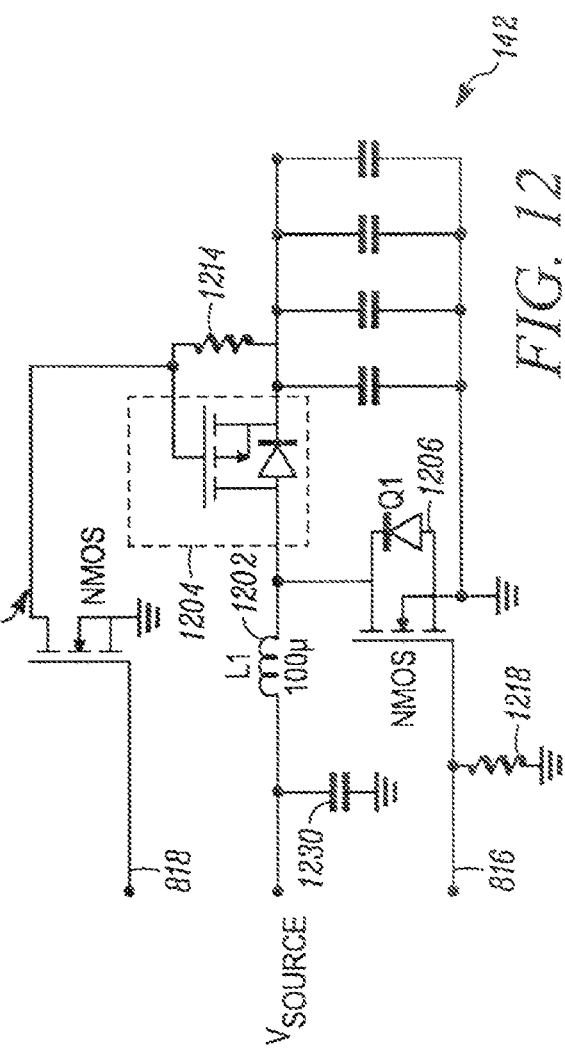
FIG. 12 is another example of an embodiment of a circuit for controlling at least one piezoelectric actuator, being the practical optimization of the concept shown in FIG. 11.

Whereas the circuit shown in FIG. 11 is used mainly for describing the concept more understandably, FIG. 12 illustrates the preferable embodiment of a circuit for controlling a piezoelectric actuator 1200 which, again, recycles energy from the charged piezoelectric actuator 142 back to a supply voltage rail or rechargeable battery which is used to power the circuit. The one advantage to the circuit shown in FIG. 11 is that the recycled energy may be provided for use by another circuit via alternate routing of path 1102.

As shown in FIG. 12, a single inductor 1202 may be employed in the place of the two inductors 1106 and 1120, and a single PMOS transistor 1204 is used to replace the boost diode 1110 and the PMOS FET switch 1118. The body diode of the transistor 1204 is thus used as the boost circuit's boost diode 1110. It will be recognized that the circuits described herein may be implemented in an integrated circuit, multiple integrated circuits or any suitable manner. The circuit also includes a charging control transistor 1206 as well as a level-shifting discharge control transistor 1208 coupled to the high-side PMOS transistor 1204 as shown. A pull-up resistor 1214 is operatively coupled to the transistor 1208 and to the high-side switch transistor 1204. If desired, another optional impedance element 1218 may also be employed; again, to prevent unintended operation of the NMOS boost FET 1206. In the circuit's discharge phase, it operates as a "buck switcher", in order that the energy from the piezoelectric actuator 142 may then be returned to its source 1230, through the very same inductor 1202 through which the energy from that source first came. Again as noted, the PMOS FET's body diode is used as the boost diode to charge the piezoelectric actuator 142 under control of the pulse-width-modulated control signal 816 and transistor 1206. The drive circuit includes the inductive element 1202 that is coupled to both the high-side switch FET 1204 and the voltage source node shown as 1230.

Among other advantages, the circuit shown in FIG. 12 may use fewer components compared to that of FIG. 11. In addition, the circuits of FIGS. 11 and 12 effectively may improve overall efficiency by allowing the recycling of the piezoelectric energy back to the battery rail or any other suitable voltage source node, if desired.

The above circuits may be used, for example, as part of a keypad that includes a touch screen that includes the piezoelectric actuator that is suitably coupled to other mechanical mechanisms as described, for example, above that is operative to provide tactile feedback in response to touch screen contact by a user. A handheld electronic device, such as a cell phone or other electronic device as noted above may include wireless telephone circuitry as known in the art and a keypad coupled to the wireless telephone circuitry as known in the art and may include any of the circuits (or any suitable combination thereof) described above to make a unique device in a relatively low cost and high reliability manner. Other advantages will be recognized by those of ordinary skill in the art.

In addition, a method includes controlling actuation of a piezoelectric actuator of a touch screen by generating a first pulse-width-modulated control signal 816 to control a charging circuit 806 to produce a portion (rising) of a voltage drive signal 904 and generating another pulse-width-modulated control signal 818 to control a pulsed current sink discharge circuit 804 to controllably draw pre-determined packets of charge from a charged piezoelectric actuator to produce another portion of the voltage drive signal (e.g., falling portion).

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A circuit for controlling a piezoelectric actuator comprising:
   a piezoelectric actuator drive circuit operative to generate a unidirectional voltage drive signal, comprising a charging circuit operatively responsive to a first pulse-width-modulated control signal and a pulsed current sink discharge circuit operatively responsive to a second pulse-width-modulated control signal and operative to controllably draw packets of charge from a charged piezoelectric actuator.

2. The circuit of claim 1 comprising:
   the piezoelectric actuator operatively coupled to the piezoelectric actuator drive circuit; and
   a control signal generating circuit operative to produce the first and second pulse-width-modulated control signals having varying duty cycles to produce the unidirectional voltage drive signal to actuate the piezoelectric actuator.

3. The circuit of claim 2 wherein the pulsed current sink discharge circuit is operatively coupled to return energy from the piezoelectric actuator to a voltage source node.

4. The circuit of claim 2 wherein the unidirectional voltage drive signal is a raised cosine signal.

5. The circuit of claim 1 wherein the pulsed current sink discharge circuit comprises a constant current sink discharge circuit.

6. A keypad comprising:
   a touchscreen comprising a piezoelectric actuator operative to provide tactile feedback in response to touchscreen contact by a user; and
   a circuit operative to control the piezoelectric actuator comprising:
      a piezoelectric actuator drive circuit operative to generate a unidirectional voltage drive signal comprising a charging circuit operatively responsive to a first pulse-width-modulated control signal and a pulsed current sink discharge circuit operatively responsive to a second pulse-width-modulated control signal and operative to controllably draw packets of charge from a charged piezoelectric actuator.

7. The keypad of claim 6 wherein the piezoelectric actuator drive circuit comprises a control signal generating circuit operative to produce the first and second pulse-width-modulated control signals having varying duty cycles to produce the unidirectional voltage drive signal in an open-loop manner of operation to actuate the piezoelectric actuator.

8. The keypad of claim 6 wherein the pulsed discharge circuit is operatively coupled to recycle energy from the piezoelectric actuator to a voltage source node.

9. The keypad of claim 6 wherein the pulsed current sink discharge circuit comprises:
   a discharge switching transistor having an input operatively responsive to the second pulse-width-modulated control signal and an output coupled to a resistive element;
   an output pass transistor having an input operatively coupled to the output of the discharge switching transistor; and
   an inductive element operatively coupled to the voltage source node and to the output pass transistor.

10. The keypad of claim 6 wherein the charging circuit includes a field effect transistor configured to have a body diode thereof and wherein the pulsed current sink discharge circuit comprises the FET and wherein the piezoelectric actuator drive circuit comprises an inductive element operatively coupled to both the FET and a voltage source node.

11. The keypad of claim 10 wherein the voltage source node is coupled to a power supply voltage that supplies the circuit.

12. A handheld electronic device comprising:
    wireless telephone circuitry; and
    a keypad operatively coupled to the wireless telephone circuitry comprising:
       a touchscreen comprising a piezoelectric actuator operative to provide tactile feedback in response to touchscreen contact by a user; and
       a circuit operative to control the piezoelectric actuator comprising:
          a piezoelectric actuator drive circuit operative to generate a unidirectional voltage drive signal comprising a charging circuit operatively responsive to a first pulse-width-modulated control signal and a pulsed current sink discharge circuit operatively responsive to a second pulse-width-modulated control signal and operative to controllably draw packets of charge from a charged piezoelectric actuator.

13. The handheld electronic device of claim 12 wherein the piezoelectric actuator drive circuit comprises a control signal generating circuit operative to produce the first and second pulse-width-modulated control signals having varying duty cycles to produce the unidirectional voltage drive signal to actuate the piezoelectric actuator.

14. The handheld electronic device of claim 13 wherein the pulsed current sink discharge circuit is operatively coupled to feedback energy from the piezoelectric actuator to a voltage source node.

15. The handheld electronic device of claim 14 wherein the pulsed current sink discharge circuit comprises:
    a discharge switching transistor having an input operatively responsive to the second pulse-width-modulated control signal and an output coupled to a resistive element;
    an output pass transistor having an input operatively coupled to the output of the discharge switching transistor; and
    an inductive element operatively coupled to the voltage source node and to the output pass transistor.

16. The handheld electronic device of claim 14 wherein the charging circuit includes a field effect transistor configured to have a body diode thereof and wherein the pulsed current sink discharge circuit comprises the FET and wherein the piezoelectric actuator drive circuit comprises an inductive element operatively coupled to both the FET and a voltage source node.

17. The keypad of claim 16 wherein the voltage source node is coupled to a power supply voltage that supplies the circuit.

18. A method comprising:
controlling actuation of a piezoelectric actuator of a touchscreen by generating a first pulse-width-modulated control signal to control a charging circuit to produce a portion of a unidirectional voltage drive signal and generating a second pulse-width-modulated control signal to control a pulsed current sink discharge circuit to controllably draw packets of charge from a charged piezoelectric actuator to produce another portion of the unidirectional voltage drive signal.

19. The method of claim 18 comprising feeding back energy from a charged piezoelectric actuator to a voltage source node.

20. A circuit for controlling a piezoelectric actuator comprising:
a piezoelectric actuator drive circuit operative to generate a unidirectional voltage drive signal, comprising a charging circuit operatively responsive to a first pulse-width-modulated control signal and a switched inductance discharge circuit operatively responsive to a second pulse-width-modulated control signal and operative to controllably draw packets of charge from a charged piezoelectric actuator.

21. The circuit of claim 20 wherein the switched-inductance discharge circuit comprises:
a discharge control transistor having an input operatively responsive to the second pulse-width-modulated control signal and an output coupled to an output pass transistor;
an output pass transistor having an input operatively coupled to the output of the discharge switching transistor; and
an inductive element operatively coupled to the output pass transistor and to either a voltage supply rail for another circuit, or to ground.

22. The circuit of claim 21 wherein the switched inductance discharge circuit includes a PMOS FET configured to have a body diode thereof coupled as a charging circuit boosting diode and wherein the switched inductance discharge circuit comprises that PMOS FET with a low-side discharge-control transistor, and wherein the piezoelectric actuator drive circuit comprises an inductive element operatively coupled to both the PMOS FET and the circuit's voltage source node.

* * * * *